United States Patent [19]

Nagai et al.

[11] Patent Number: 4,784,910

[45] Date of Patent: Nov. 15, 1988

[54] METHOD FOR GIVING ELECTRIC CONDUCTIVITY TO MOLDED POLYMER ARTICLE

[75] Inventors: Shoichi Nagai; Saburo Hiraoka; Mitsuo Senga; Shinji Hama, all of Nagoya, Japan

[73] Assignee: Mitsubishi Rayon Co., Ltd., Tokyo, Japan

[21] Appl. No.: 884,145

[22] Filed: Jul. 10, 1986

[30] Foreign Application Priority Data

Jul. 15, 1985 [JP] Japan ................................. 60-155813

[51] Int. Cl.$^4$ .............................................. B32B 9/00
[52] U.S. Cl. .............................. 428/389; 427/443.1; 427/126.1
[58] Field of Search ......................... 427/443.1, 126.1; 428/389

[56] References Cited

U.S. PATENT DOCUMENTS

| | | | |
|---|---|---|---|
| 3,666,552 | 5/1972 | Ayukawa | 106/1.26 |
| 4,248,633 | 2/1981 | Heijnen | 106/1.26 |
| 4,267,233 | 5/1981 | Tanaka | 427/400 |
| 4,364,739 | 12/1982 | Tomibe | 427/443.1 |
| 4,374,893 | 2/1983 | Aksac | 427/304 |
| 4,378,226 | 3/1983 | Tomibe | 428/394 |
| 4,410,593 | 10/1983 | Tomibe | 428/389 |
| 4,556,508 | 12/1985 | Tomibe | 428/389 |

Primary Examiner—Shrive Beck
Assistant Examiner—Vi Duong Dang
Attorney, Agent, or Firm—Armstrong, Nikaido, Marmelstein & Kubovcik

[57] ABSTRACT

A method for giving high and durable electric conductivity to molded polymer articles, which comprises heat-treatment of the articles in an aqueous solution containing a copper salt, a reducing sulfur compound, and a water-soluble basic salt of nitrogen-containing organic compound having at least 12 carbon atoms.

10 Claims, No Drawings

METHOD FOR GIVING ELECTRIC CONDUCTIVITY TO MOLDED POLYMER ARTICLE

INDUSTRIAL APPLICATION FIELDS

The present invention relates to a method for giving electric conductivity [hereinafter electric conductivity (electrically conductive) is simply referred to as conductivity (conductive)] to molded polymer articles and more particularly to a method for giving durable and high conductivity to molded articles of various polymers while preserving transparency.

PRIOR ART

In the prior art of incorporating copper sulfide into macromolecular materials to give conductivity thereto, there are known techniques which comprise treating a macromolecular material having functional groups, e.g. cyano, amino, hydroxyl, carboxyl, amide residue or urethane residue or a macromolecular material having open cells or rough surface, in an aqueous solution containing a copper salt and a reducing sulfur compound, thereby forming a conductive layer of copper sulfide on the surface of the macromolecular material (Japanese patent application Laid-Open Nos. 132508/84, 239234/85, and 163708/84). However, these techniques in any case are only applicable to polymers having specific functional groups or to polymer materials provided with either open cells in their superfical regions or rough surfaces by previous treatment.

The present inventors made studies for the purpose of providing high conductivity to either molded articles of polymers which contain none of such specific functional groups as mentioned above or molded polymer articles which have received no special surface treatment such as surface roughening. As a result it was found that even on a molded polymer article where the adhesion or inclusion of copper sulfide could never be accomplished, a highly conductive layer of copper sulfide can be formed by treating the molded polymer article in an aqueous solution containing a copper salt and a reducing sulfur compound in the presence of a certain kind of substance and that the transparency of the molded polymer article, if it is transparent, is scarcely impaired by the above treatment. Based on this finding, the present invention has been accomplished.

OBJECT OF THE INVENTION

An object of the invention is to provide a method for giving high conductivity to molded polymer articles. Another object of the invention is to provide a method for yielding various shapes of polymer articles having high conductivity and transparency.

CONSTRUCTION OF THE INVENTION

The invention involves a method for giving conductivity to molded polymer articles which comprises heat-treatment of the articles in an aqueous solution containing a copper salt, a reducing sulfur compound, and a water-soluble basic salt of nitrogen-containing organic compound having at least 12 carbon atoms.

The present invention is described below in detail.

As to the molded polymer article to which the method of the invention is applied, the polymer can be freely chosen without particular restriction on its kind, from thermoplastic or thermosetting resins including, for example, acrylic resin, polyolefin resin, poly (vinyl chloride) resin, poly (vinylidene chloride) resin, polystyrene resin, polyester resin, polycarbonate resin, polyphenylene sulfide resin, polyacetal resin, phenolic resin, and epoxy resin. Shapes of the molded polymer articles to which the method of the invention is applicable may be of intermediate polymeric materials, i.e. shapes of powders, pellets, filaments, rods, films, plates, etc., and may be of various final polymer products fabricated from such intermediate polymer materials by a variety of processing methods including extrusion, compression molding, injection molding, etc. While applicable to opaque molded polymer articles, the method of the invention is favorably applied to colored or colorless transparent molded polymer articles since conductivity can be given to such transparent articles without impairing their transparency according to the present method.

In the present invention, the copper salt used in the aqueous solution to treat molded polymer articles can react with sulfur of the reducing sulfur compound to form copper sulfide. Preferred copper salts herein are, for example, cupric sulfate, cupric chloride, and cupric nitrate.

Suitable reducing sulfur compounds include, for example, sodium thiosulfate, sodium hydrogensulfite, sodium pyrosulfite, sodium sulfide, and sodium hydrogensulfide, of which sodium thiosulfate is preferable.

The water-soluble basic salt of nitrogen-containing organic compound having at least 12 carbon atoms, the use of which characterizes the present invention, is selected from the compounds roughly classifiable into two groups, one group including laurylamine hydrochloride, dodecylmethylamine hydrochloride, octadecyltrimethylammonium chloride, hexadecyltrimethylammonium chloride, tetradecyltrimethylammonium chloride, and benzyldimethyldodecylamoonium chloride and the other group including C.I. Basic Blue 1, C.I.Basic Blue 3, C.I.Basic Blue 5, C.I. Basic Blue 7, C.I. Basic Violet 1, and C.I. Basic Green 4 [C.I. is COLOUR INDEX (published by THE SOCIETY OF DYERS AND COLOURISTS)]. It is necessary in the present invention to use at least one compound selected from these groups.

The treatment of a molded polymer article is accomplished by immersing it in an aqueous solution containing said copper salt, reducing sulfur compound, and water-soluble basic salt of nitrogen-containing organic compound having at least 12 carbon atoms, and heating the aqueous solution. Preferably, the molded polymer article is immersed in the aqueous solution at a temperature of about 25° C., where no copper sulfide is yet formed, and then the aqueous solution is heated. Rapid heating of the solution should be avoided. Suitable rates of the heating are about 1 to 10° C./min. The upper limit of the heating temperatures should be below the temperature at which the molded polymer article to be treated begins deforming.

In the aqueous solution used for the treatment, suitable concentrations of the copper salt are 0.01 to 5% by weight and those of the reducing sulfur compound are equimolar with the used copper salt or slightly excess thereof. The nitrogen-containing organic compound is used desirably in an amount of 0.1 to 10% by weight based on the used copper salt.

In the present invention, the copper salt reacts with the reducing sulfur compound during the treatment, forming copper sulfide, which may grow from very fine monomolecular-like particles into large agglomerates. However, before particles of the copper sulfide grow into such agglomerates, the water-soluble basic salt of nitrogen-containing organic compound acts as a carrier, causing fine particles of the copper sulfide to diffuse in finely dispersed form into the molded polymer article through its whole surface, thus forming a superficial conductive layer comprising copper sulfide in the article.

If the water-soluble basic salt of nitrogen-containing organic compound is absent, particles of the copper sulfide will grow into too large agglomerates to diffuse into the molded polymer article, so that such a superficial conductive layer will not be formed. It may also be noted that when the polymer of the molded article has specific functional groups, particles of the copper sulfide are adsorbed preferentially onto the functional groups, and hence the fixation of much copper sulfide is required in order to obtain sufficient conductivity.

In the present invention, if the amount of the water-soluble basic salt of nitrogen-containing organic compound used is too large, tarry matter containing copper sulfide will form and disturb the diffusion of copper sulfide into the molded polymer article, and if said amount is too small, copper sulfide will be difficult to disperse finely and hence will be hardly carried by the water-soluble basic salt.

In the present invention, it is necessary to pay attention to the temperature of the aqueous solution during treatment of molded polymer articles after immersion of them, that is, the aqueous solution needs to be heated and kept at such a temperature that particles of copper sulfide formed by the treatment are of very fine monomolecular sizes and this finely dispersed state lasts as long as possible. When the treatment temperature is too low, copper sulfide formation is slow and the diffusion of copper sulfide into the molded polymer article is inhibited on account of depressed molecular movement. On the contrary, when the temperature is too high, copper sulfide forms rapidly but grows quickly to large particles, resulting in shortening the time during which copper sulfide can diffuse into the molded polymer article. In both the cases, sufficient conductivity cannot be obtained.

Effects of the heating temperature vary with the kinds of copper salt, reducing sulfur compound, and molded polymer article used and with the necessary degree of conductivity. Hence it is recommended to control these effects by suitable selection of the above noted rate of heating, maximum temperature of the aqueous solution for treatment, and duration of this temperature.

Enough fixing amounts of copper sulfide to give sufficient conductivity according to the invention range from $5 \times 10^{-7}$ to $1 \times 10^{-4}$ g/cm$^2$. If said fixing amount is less than $5 \times 10^{-7}$ g/cm$^2$, such a continuous conductive layer will not be formed and hence conductivity is not given to the molded polymer article. If said fixing amount exceeds $1 \times 10^{-4}$ g/cm$^2$, notable increase in the conductivity will be no longer observed and additionally the transparency will be impaired. This is undesirable for the purpose of securing the transparency of molded polymer articles.

EFFECT OF THE INVENTION

According to the invention, a continuous superficial conductive layer comprising copper sulfide is formed in a molded polymer article, thereby giving sufficient conductivity to the article.

The present invention makes it possible to give sufficient conductivity to molded polymer articles at low costs without any limitation on the kind of polymer or on the shape of article, specially to various molded polymer articles for use in the fields, particularly the electronic field, where conductive or antistatic polymer articles are required. For example, molded polymer articles of the present invention are preferably used for housing and parts of electric and electronic machinery and tool, and container of them.

The following examples illustrate the present invention.

EXAMPLE 1

Plates and films of various polymers shown in the following table were each immersed in a 25° C. aqueous solution containing 0.2 wt % of cupric sulfate (5H$_2$O), 0.2 wt % of sodium thiosulfate (5H$_2$O), and 0.002 wt % of hexadecyltrimethylammonium chloride. The solution was heated with stirring up to 70° C. at a rate of 2° C./min and maintained at this temperature for 20 min to treat the plate or film, which was then washed with flowing water and dried. Thus, superficial layers brown-green colored uniformly with copper sulfide were provided to the polymer plates and films.

The treated polymer plates and films were measured for surface electric resistance. Results of the measurement are shown in the following table.

Excellent conductivity could be given to any of the plates and films of various polymers according to the invention.

TABLE 1

| Polymer | Type of shape | Surface electric resistance ($\Omega$/cm$^2$) | Amount of copper sulfide fixed (g/cm$^2$) |
| --- | --- | --- | --- |
| Poly (methyl methacrylate) | Plate | $2 \times 10^2$ | $3.0 \times 10^{-5}$ |
| Polyethylene terephthalate | Film | $2 \times 10^2$ | $1.4 \times 10^{-5}$ |
| Polycarbonate | Plate | $2 \times 10^2$ | $1.6 \times 10^{-5}$ |
| Polypropylene | Film | $3 \times 10^2$ | $1.4 \times 10^{-5}$ |
| Polyethylene | Film | $2 \times 10^2$ | $1.7 \times 10^{-5}$ |
| Poly (vinyl chloride) | Film | $2 \times 10^2$ | $1.5 \times 10^{-5}$ |
| Poly (vinylidene chloride) | Film | $6 \times 10^2$ | $1.0 \times 10^{-5}$ |
| Polystyrene | Plate | $5 \times 10^2$ | $1.0 \times 10^{-5}$ |
| Polyacetal | Plate | $2 \times 10^2$ | $2.0 \times 10^{-5}$ |
| ABS resin | Plate | $2 \times 10^2$ | $2.2 \times 10^{-5}$ |
| Phenol resin | Plate | $8 \times 10^2$ | $1.8 \times 10^{-5}$ |
| Epoxy resin | Plate | $3 \times 10^2$ | $1.8 \times 10^{-5}$ |
| Polyphenylene sulfide | Film | $8 \times 10^2$ | $1.5 \times 10^{-5}$ |
| Polyimide | Film | $2 \times 10^2$ | $1.7 \times 10^{-5}$ |
| Aromatic polyamide | Film | $3 \times 10^2$ | $1.5 \times 10^{-5}$ |

For comparison, the same polymer plates and films as used in the above example were each treated similarly by using an aqueous solution containing 0.2 wt % of cupric sulfate (5H$_2$O) and 0.2 wt % of sodium thiosulfate (5H$_2$O). The results showed that no conductive layer of copper sulfide was formed on or in any polymer plate or film treated, that is, no conductivity was given thereto.

EXAMPLE 2

A 100-nm thick clear polyethylene terephthalate film was immersed in a 25° C. aqueous solution containing 0.2 wt % of cupric sulfate (5H$_2$O), 0.2 wt % of sodium thiosulfate (5H$_2$O), and 0.002 wt % each of water-soluble basic salts of nitrogen-containing organic compounds shown in the following table. The solution was heated with stirring up to 70° C. at a rate of 2° C./min and maintained at this temperature for 20 min to treat the film, which was then washed with flowing water and dried. Thus a superficial layer brown-green colored with copper sulfide was provided to the film.

The films treated in the presence separately of various water-soluble basic salts of nitrogen-containing organic compounds were measured for surface electric resistance and light transmittance (wavelength 550 nm). Results of the measurement are shown in the following table.

TABLE 2

| Water-soluble basic salt of nitrogen-containing organic compound | Surface electric resistance ($\Omega/cm^2$) | Light transmittance* (%) |
| --- | --- | --- |
| C.I. Basic Blue 1 | $6 \times 10^2$ | 61 |
| C.I. Basic Blue 3 | $8 \times 10^2$ | 64 |
| C.I. Basic Blue 5 | $2 \times 10^2$ | 53 |
| C.I. Basic Blue 7 | $2 \times 10^2$ | 52 |
| C.I. Basic Violet 1 | $3 \times 10^2$ | 54 |
| C.I. Basic Green 4 | $6 \times 10^2$ | 58 |

*The light transmittance of the untreated film was assumed as 100%.

EXAMPLE 3

A plain-woven fabric composed of polyethylene terephthalate filaments of 5d monofilament size was immersed at a bath ratio of 1:10 in a 25° C. aqueous solution containing 0.2 wt % of cupric sulfate ($5H_2O$), 0.2 wt % of sodium thiosulfate ($5H_2O$), and 0.002 wt % of hexadecyltrimethylammonium chloride. The solution was heated to 85° C. at a rate of 1° C./min. Then the fabric was washed with water and dried. The treated fabric showed brown-green color.

Cross sections of monofilaments constructing the treated fabric were observed with a microscope, thereby confirming the presence of a superficial layer of copper sulfide in each monofilament. The treated fabric was found to have a surface electric resistance of $2 \times 10^2$ $\Omega/cm^2$, thus exhibiting excellent conductivity.

EXAMPLE 4

A 3-mm thick clear poly (methyl methacrylate) resin plate was immersed in a 25° C. aqueous solution containing 0.25 wt % of cupric chloride ($2H_2O$), 0.4 wt % of sodium thiosulfate, and 0.006 wt % of octadecyltrimethylammonium chloride. The solution was heated with stirring up to 70° C. at a rate of 10° C./min and maintained at this temperature for 20 min to treat the plate, which was then washed with flowing water and dried.

Thus a superficial conductive copper sulfide layer of $1.6 \times 10^{-5}$ $g/cm^2$ was formed in either side of the resin plate. This resin plate exhibited a surface resistance of $2 \times 10^2$ $\Omega/cm^2$ and a light transmittance (wavelength 550 nm) of 65%, thus having excellent conductivity and transparency.

What is claimed is:

1. A method for giving electric conductivity to a molded polymer article which comprises heat-treating a molded polymer article in an aqueous solution consisting essentially of a copper salt, a reducing sulfur compound, and 0.1 to 10% by weight, based on the copper salt, of a water-soluble basic salt of a nitrogen-containing organic compound having at least 12 carbon atoms, to form a conductive layer comprising copper sulfide on the surface layer of the molded polymer article.

2. The method of claim 1, wherein the copper salt is at least one member selected from the group consisting of cupric sulfate, cupric chloride, and cupric nitrate.

3. The method of claim 1, wherein the reducing sulfur compound is sodium thiosulfate.

4. The method of claim 1, wherein the water-soluble basic salt of nitrogen-containing organic compound having at least 12 carbon atoms is at least one member selected from the group consisting of laurylamine hydrochloride, dodecylmethylamine hydrochloride, octadecyltrimethylammonium chloride, hexadecyltrimethylammonium chloride, tetradecyltrimethylammonium chloride, and benzyldimethyldodecylammonium chloride.

5. The method of claim 1, wherein the water-soluble basic salt of nitrogen-containing organic compound having at least 12 carbon atoms is at least one member selected from the group consisting of C.I. Basic Blue 1, C.I. Basic Blue 3, C.I. Basic Blue 5, C.I. Basic Blue 7, C.I. Basic Violet 1, and C.I. Basic Green 4.

6. The method of claim 1, wherein the molded polymer articles are formed of at least one member selected from the group consisting of acrylic resin, polyolefin resin, poly (vinyl chloride) resin, poly (vinylidene chloride) resin, polystyrene resin, polyester resin, polycarbonate resin, polyphenylene sulfide resin, polyacetal resin, phenolic resin, and epoxy resin.

7. The method of claim 1, wherein the aqueous solution used for the treatment contains 0.01 to 5% by weight of the copper salt.

8. The method of claim 1, wherein the aqueous solution used for the treatment contains the reducing sulfur compound in an amount at least equimolar with the copper salt.

9. The method of claim 1, wherein the molded polymer articles are immersed in the treating solution at room temperature before heating the treating solution.

10. An electrically conductive molded polymer article obtained by the method set forth in claim 1.

* * * * *